United States Patent
Doris et al.

(10) Patent No.: US 8,497,168 B2
(45) Date of Patent: Jul. 30, 2013

(54) STRUCTURE AND METHOD TO ENHANCE BOTH NFET AND PFET PERFORMANCE USING DIFFERENT KINDS OF STRESSED LAYERS

(75) Inventors: Bruce B. Doris, Brewster, NY (US); Haining Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/071,940

(22) Filed: Mar. 25, 2011

(65) Prior Publication Data

US 2011/0195581 A1   Aug. 11, 2011

Related U.S. Application Data

(62) Division of application No. 10/695,748, filed on Oct. 30, 2003, now Pat. No. 8,008,724.

(51) Int. Cl.
*H01L 21/335* (2006.01)
*H01L 21/8232* (2006.01)

(52) U.S. Cl.
USPC ............ 438/142; 438/199; 438/275; 438/279

(58) Field of Classification Search
USPC ................................. 438/142, 199, 275, 279
See application file for complete search history.

(56) References Cited

U.S. PATENT DOCUMENTS

| | | | |
|---|---|---|---|
| 6,069,049 A | 5/2000 | Geiss et al. | |
| 6,399,976 B1 | 6/2002 | Geiss et al. | |
| 6,573,172 B1 | 6/2003 | En et al. | |
| 6,717,216 B1 | 4/2004 | Doris et al. | |
| 6,825,529 B2 | 11/2004 | Chidambarrao et al. | |
| 6,882,025 B2 | 4/2005 | Yeo et al. | |
| 7,115,954 B2 * | 10/2006 | Shimizu et al. | |
| 2003/0040158 A1 | 2/2003 | Saito | |
| 2003/0181005 A1* | 9/2003 | Hachimine et al. | ........... 438/231 |
| 2004/0029323 A1 | 2/2004 | Shimizu et al. | |
| 2004/0113174 A1 | 6/2004 | Chidambarrao et al. | |
| 2004/0159834 A1 | 8/2004 | Huang et al. | |
| 2004/0262784 A1 | 12/2004 | Doris et al. | |
| 2004/0266122 A1 | 12/2004 | Cheng et al. | |
| 2005/0035470 A1 | 2/2005 | Ko et al. | |
| 2005/0093078 A1 | 5/2005 | Chan et al. | |
| 2005/0098829 A1 | 5/2005 | Doris et al. | |

* cited by examiner

*Primary Examiner* — Phat X Cao
(74) *Attorney, Agent, or Firm* — Whitham, Curtis, Christofferson & Cook, P.C.; Joseph P. Abate (57) ABSTRACT

In producing complementary sets of metal-oxide-semiconductor (CMOS) field effect transistors, including nMOS and pMOS transistors), carrier mobility is enhanced or otherwise regulated through the use of layering various stressed films over either the nMOS or pMOS transistor (or both), depending on the properties of the layer and isolating stressed layers from each other and other structures with an additional layer in a selected location. Thus both types of transistors on a single chip or substrate can achieve an enhanced carrier mobility, thereby improving the performance of CMOS devices and integrated circuits.

9 Claims, 10 Drawing Sheets

STRUCTURE AND METHOD TO ENHANCE BOTH NFET AND PFET PERFORMANCE USING DIFFERENT KINDS OF STRESSED LAYERS

CROSS-REFERENCE TO RELATED APPLICATIONS

This application is a division of U.S. patent application Ser. No. 10/695,748, filed Oct. 30, 2003, now U.S. Pat. No. 8,008,724 which is hereby fully incorporated by reference and priority of the filing date thereof is hereby claimed.

BACKGROUND OF THE INVENTION

1. Field of the Invention

The present invention generally relates to the manufacture of transistors for integrated circuits and, more particularly, to the production of complementary pairs of field effect transistors of enhanced performance at extremely small scale.

2. Description of the Prior Art

Performance and economic factors of integrated circuit design and manufacture have caused the scale of elements (e.g. transistors, capacitors and the like) of integrated circuits to be drastically reduced in size and increased in proximity on a chip. That is, increased integration density and proximity of elements reduces the signal propagation path length and reduces signal propagation time and susceptibility to noise and increase of possible clock rates while the reduction in element size necessary for increased integration density increases the ratio of functionality which can be provided on a chip to the costs of production (e.g. wafer/chip area and process materials) per chip and, potentially, the cost of devices containing the chips by reducing the number of inter-chip and inter-board connections required.

However, the immutable material properties and physical effects by which transistors and other elements function is invariably compromised as the scale of integrated circuit elements is reduced. In response, many improvements in transistor design have been made to maintain suitable levels of performance of these elements. For example, lightly doped drain (LDD) structures (now generally referred to as extension implants since heavier doping levels have been required in current minimum feature size regimes), halo implants and graded impurity profiles have been employed to counteract short channel and punch-through effects and the like, particularly in field effect transistors (FETs) which have become the active device of choice for all but the highest frequency devices. Reduction in device scale has also required operation at reduced voltages to maintain adequate performance without device damage even though operating margins may be reduced.

A principal factor in maintaining adequate performance in field effect transistors is carrier mobility which affects the amount of current or charge which may flow (as electrons or holes) in a doped semiconductor channel under control of a voltage placed on a gate electrode insulated from the channel by a very thin dielectric. Reduced carrier mobility in an FET reduces not only the switching speed/slew rate of a given transistor but also reduces the difference between "on" resistance to "off" resistance. This latter effect increases susceptibility to noise and reduces the number of and/or speed at which downstream transistor gates (capacitive loads) can be driven, sometimes referred to as fan-out. Even during the early development of metal-oxide-semiconductor (MOS) field effect transistors and complementary MOS (CMOS) devices (widely used in integrated circuits at the present time), in particular, carrier mobility was a design concern and often required a pMOS device to be made approximately two times as large as a complementary nMOS device with which it was paired in order to obtain reasonably symmetrical operation of the CMOS pair in view of the difference in carrier mobility between electrons, the principal carrier in nMOS devices and holes, the principal carrier in pMOS devices. In more recent and critical designs, it has been shown that carrier mobility degrades in deeply scaled bulk MOS devices due to the heavy doping required to suppress short-channel effects and ultra-thin oxide effects.

It has also been shown theoretically and confirmed experimentally that mechanical stress in the channel region of an FET can increase or decrease carrier mobility significantly; depending on the sign of the stress (e.g. tensile or compressive) and the carrier type (e.g. electron or hole). Tensile stress increases electron mobility and decreases hole mobility while compressive stress increases hole mobility while decreasing electron mobility in the doped semiconductor crystal lattice forming the transistor channel. This phenomenon is well-recognized and theories concerning the physical effects by which it occurs are, in any event, unimportant to its exploitation. In this regard, numerous structures and materials have been proposed for inducing tensile or compressive force in a semiconductor material, such as shallow trench isolation (STI) structures, gate spacers, etch-stop layers and silicide which are generally included in integrated circuit designs. It is also known to induce persistent stresses in semi-conductors for structural reasons. For example, U.S. Pat. Nos. 6,069,049 and 6,399,976 teach that applying a film around a structure and then reducing volume of the film to compress the structure and thus prevent the propagation of defects. However, at the present state of the art, structures for producing stresses can generally be made of only one type; to produce tensile stress or compressive stress but not both. Therefore, in integrated circuit designs using both pFET and nFET transistors and CMOS technology (in which the logic is implemented principally by complementary pMOS and nMOS transistor pairs), in particular, an enhancement of carrier mobility in one type of transistor was necessarily accompanied by degradation of carrier mobility in the other or complementary type of transistor; yielding little, if any, net performance gain, although symmetry of operation could theoretically be improved. Moreover, stress of a single type produced by such structures tends to cause warping or curling of the wafer or substrate (particularly if thin, as is a current trend) which compromises later lithographic processes such as the formation of contacts and connections or, in severe or high stress cases, chip or wafer cracking; reducing manufacturing yield or (in rare cases) reliability after being put into service. Further, the stress levels produced by such structures were generally difficult to control particularly since the structure dimensions are often dictated by other design concerns, such as isolation and breakdown voltages.

SUMMARY OF THE INVENTION

It is therefore an object of the present invention to provide a structure and method to enhance both nFET and pFET performance by locally and simultaneously applying tensile stress or compressive stress, respectively, through use of different kinds of stressed film.

It is another object of the present invention to provide desired stresses in transistors of an integrated circuit without causing warping or curling of a wafer or substrate.

In order to accomplish these and other objects of the invention, a method of adjusting carrier mobility in CMOS devices is provided comprising the steps of depositing a first stressed film on a wafer including a complementary pair of transistors to create a stress in the channels of the transistors, partially removing the first stressed film to relieve the stress from one channel of one transistor, and depositing a second stressed film over first and second transistors to apply a second stress to the channel of the transistor with the first stressed film removed.

Through this process, a structure that adjusts carrier mobility in CMOS transistors is provided comprising a substrate, a complementary pair of transistors each having a gate dielectric, gate electrode, and source, drain, and gate silicide regions, formed on the substrate, a first film providing tensile stress at least at the channel of one transistor, a second film providing compressive stress at least at the channel of the other transistor, and a shear force isolation layer separating the first film and the second film in at least one area.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
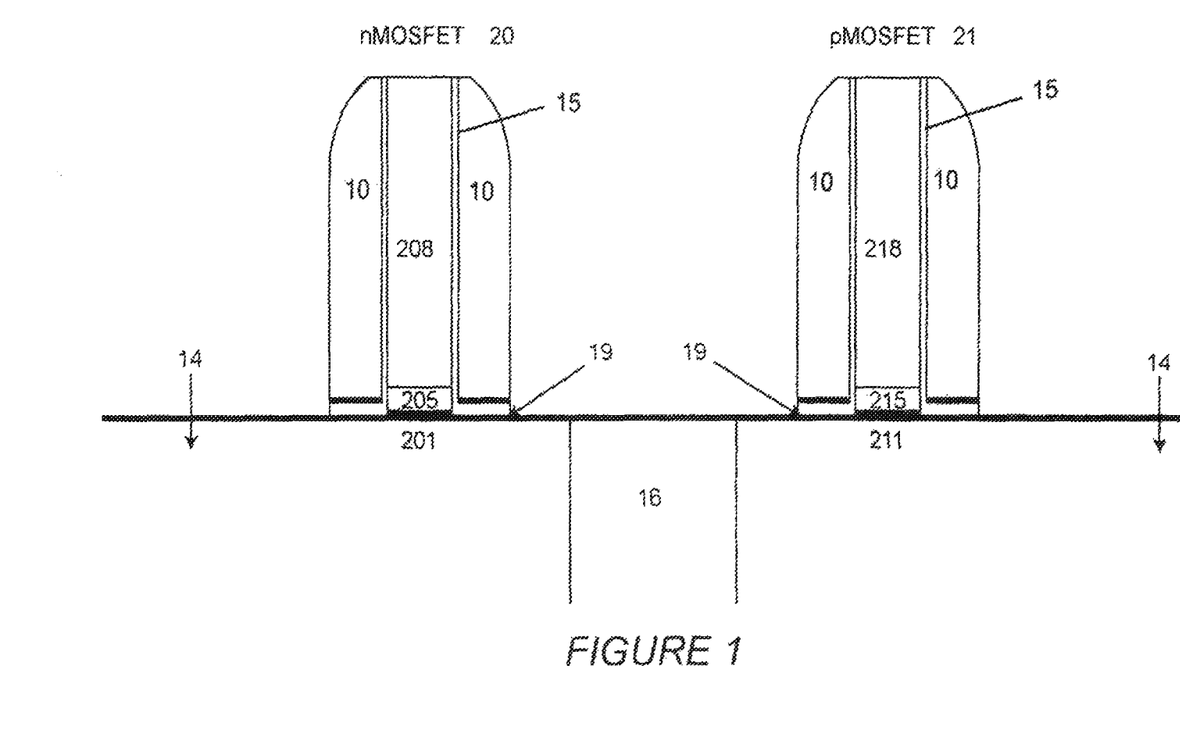
FIG. 1 is a cross-sectional view of the pre-fabricated structure to which the invention is applied in order to achieve the final exemplary pair of nMOS and pMOS transistors shown in FIG. 6.

Referring now to the drawings, and more particularly to FIG. 1, there is shown, in cross-section, an exemplary pair of complementary nMOS and pMOS transistors such as might comprise a CMOS pair in a portion of an integrated circuit. These transistors have been completed through the formation of silicide on the source, drain and gate regions to reduce resistance of contacts to be later applied thereto. The method of formation of these transistors and the particulars of their structures are unimportant to an understanding of the invention or its successful practice. It should be understood that while FIG. 1 illustrates transistors prior to the application of the invention thereto, the illustration is intended to be highly schematic for clarity and no portion of FIG. 1 is admitted to be prior art as to the invention.

In FIG. 1 and other figures, the transistors are formed on substrate 14 (which may be relatively much thicker than depicted since the transistors are possibly deeply scaled, as is the preferred application of the invention). The transistors 20 and 21 are isolated from each other by isolation oxide 16 such as shallow trench isolation which may also serve to define n-well and p-well regions of substrate 14. In this regard, transistors 20 and 21 are of complementary conductivity types and, accordingly, the portions of substrate 14 underlying these respective transistors are also oppositely doped.

The transistors 20 and 21 are otherwise of similar construction; each having a gate dielectric 205, 215, a gate electrode 208, 218, a sidewall spacer structure 10 and source, drain and gate silicide regions 19 as will be familiar to those skilled in the art preferably formed by an implant self-aligned to sidewall spacers 10. Extension and halo implants, graded junctions and the like may also be provided.

It should be appreciated in the course of the following discussion of FIGS. 1-6 that the embodiment which will be described is that which is expected to be the most advantageous in most applications and integrated circuit designs, and thus preferred, as well as being an embodiment which will allow the most complete appreciation of the invention to be conveyed. However, the principles of the invention described in connection with this embodiment can also be applied to provide any desired amount of stress of either sign to adjacent electronic elements in any design.

Figure 2:
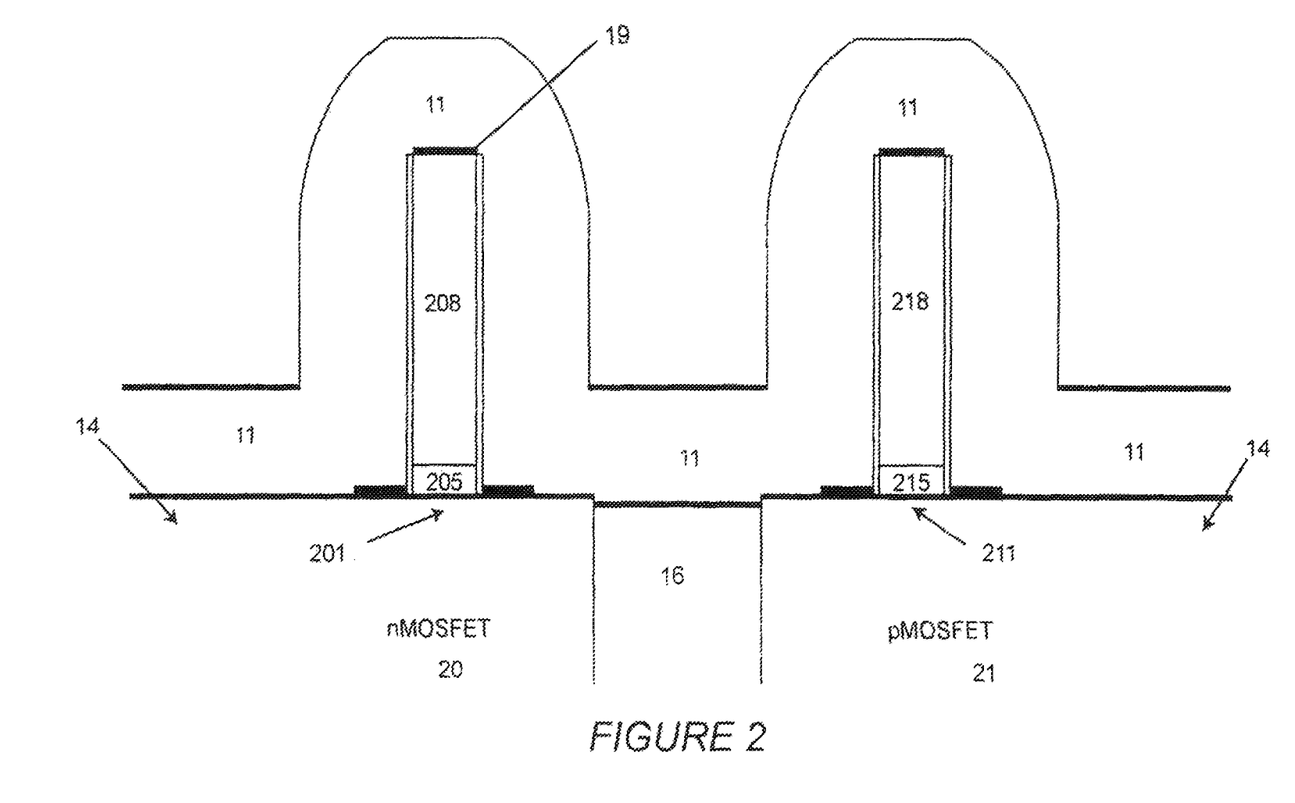
FIG. 2 is a cross-sectional view of the first production stage of the final exemplary pair of nMOS and pMOS transistors shown in FIG. 6 in which a tensile nitride film is deposited in order to produce tensile stress in the channel of devices.
Figure 6:
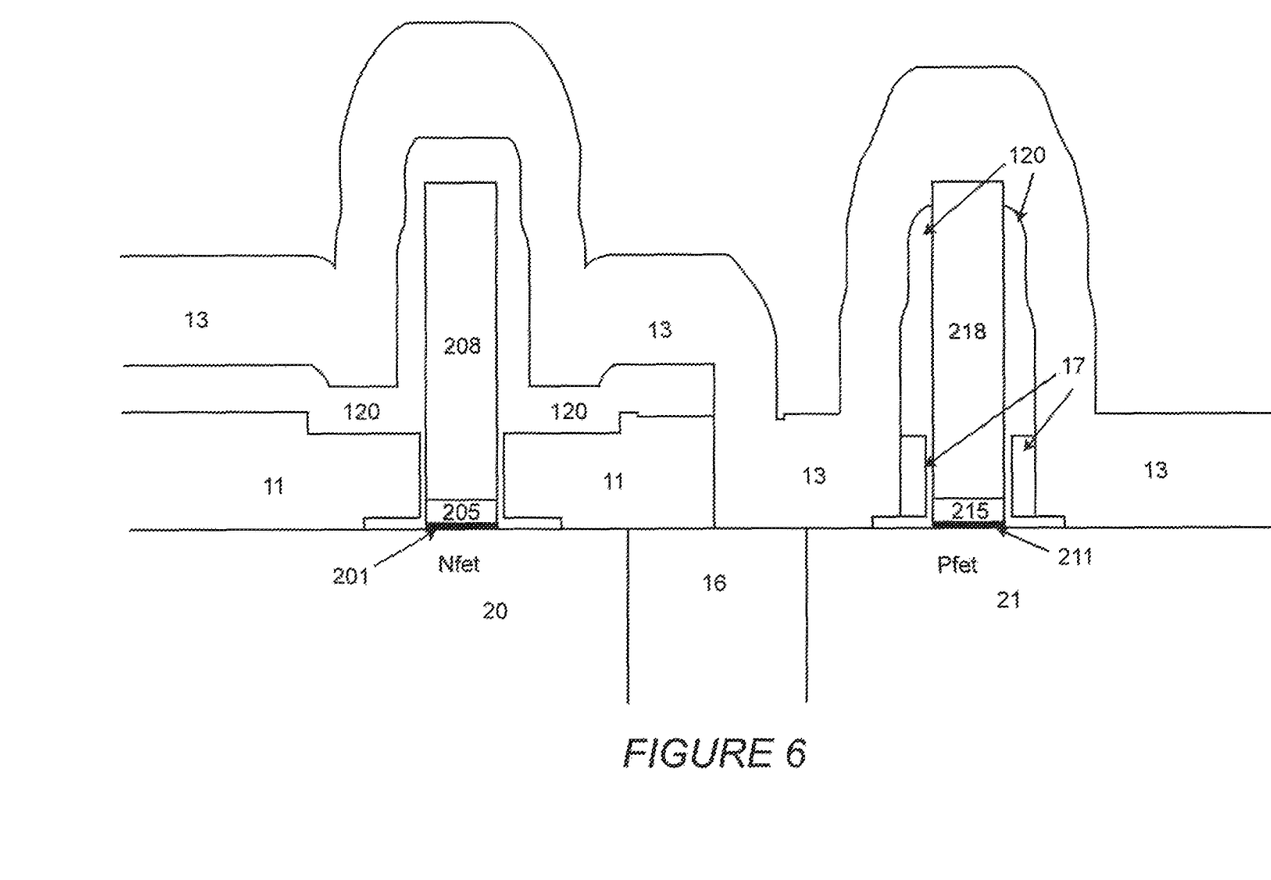
FIG. 6 is a cross-sectional view of a fifth production stage of the final exemplary pair of nMOS and pMOS transistors in which the photo resist is etched away and compressive film is deposited thereby creating the final preferred embodiment of the invention.

FIG. 2 shows the first step taken in forming the invention shown in FIG. 6 from the basic structure shown in FIG. 1. This step includes the deposit of a stressed film 11 (e.g. tensile) over the remaining structure of FIG. 1 in order to produce stress (e.g. tensile) in the channels 201, 211 of the transistors 20 and 21. Prior to the deposit of this film, the sidewall spacers 10 are optionally removed. The highly stressed film is preferably silicon nitride ($Si_3N_4$) or silicon oxynitride ($Si_3O_xN_y$) or a combination of both. These materials can be deposited in a highly stressed form providing either tensile or compressional stress, depending on particular process parameters such as plasma power and gas flow rates. For example, using a PECVD process, the stress level is mainly controlled by plasma power and, in general, yields a compressive stress. Thermal CVD $Si_3N_4$ is deposited at a temperature above 600° C. and is normally tensile. Application of this tensile stress enhances the performance of the nMOS transistor 20 while decreasing the performance abilities of the pMOS transistor 21.

Figure 3:
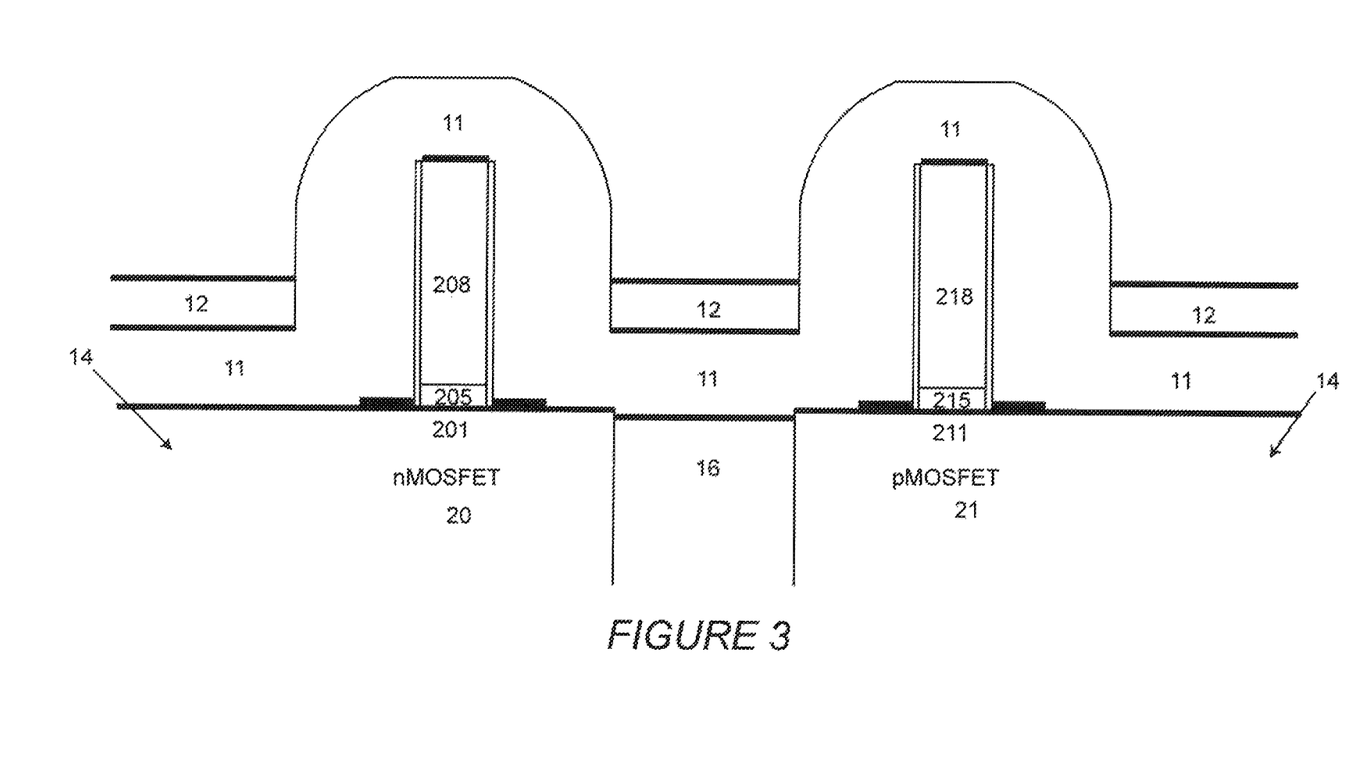
FIG. 3 is a cross-sectional view of the second production stage of the final exemplary pair of nMOS and pMOS transistors shown in FIG. 6 in which oxide is directly deposited and etched back.

FIG. 3 illustrates the second step taken toward reaching the exemplary final configuration shown in FIG. 6. In this step, a dielectric 12 (e.g. oxide) is deposited onto the structure shown in FIG. 2 via high density plasma deposition (HDP) and, for example, chemical-mechanical polish, CMP stopping on nitride 11 and then etched back to oxide 12 to form the illustrated configuration. The thickness of the oxide layer 12 is not critical to the practice of the invention, although layer thickness is preferably in the range of 50-100 nm. The dielectric 12 is preferably a non-stressed oxide or other non-stressed material to serve as an etch stop for the etch back and a neutral barrier between the tensile film 11 and the later applied compressive film 13.

Figure 4:
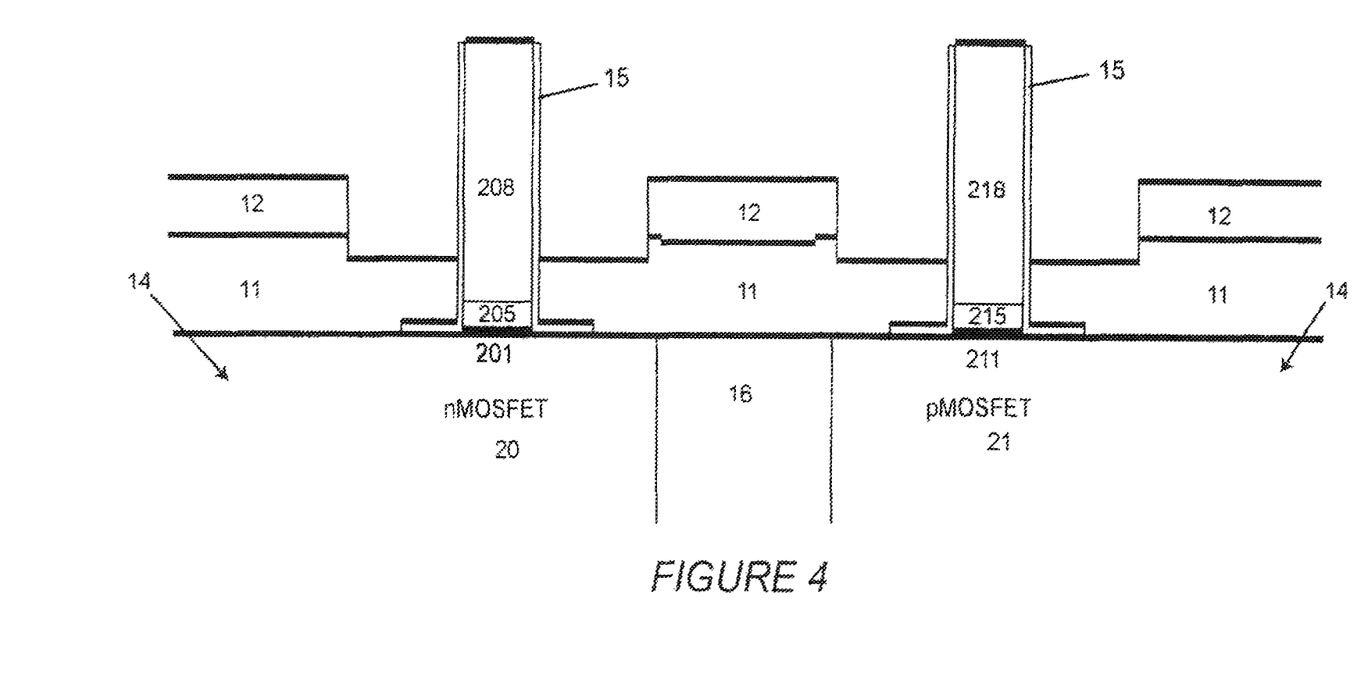
FIG. 4 is a cross-sectional view of a third production stage of the final exemplary pair of nMOS and pMOS transistors shown in FIG. 6 in which some areas of tensile nitrate are removed by method of wet etching.

FIG. 4 illustrates the third step taken toward reaching the exemplary final configuration shown in FIG. 6. The dielectric 12 deposited in the previous step is now used as a mask, creating a pattern for removing areas of the stressed film 11 via wet etching. As shown in this step, the same tensile stress is still being applied to the nMOS 20 and pMOS 21 transistors increasing the performance of the nMOS transistor 20 while decreasing the performance of the pMOS transistor 21.

Figure 5:
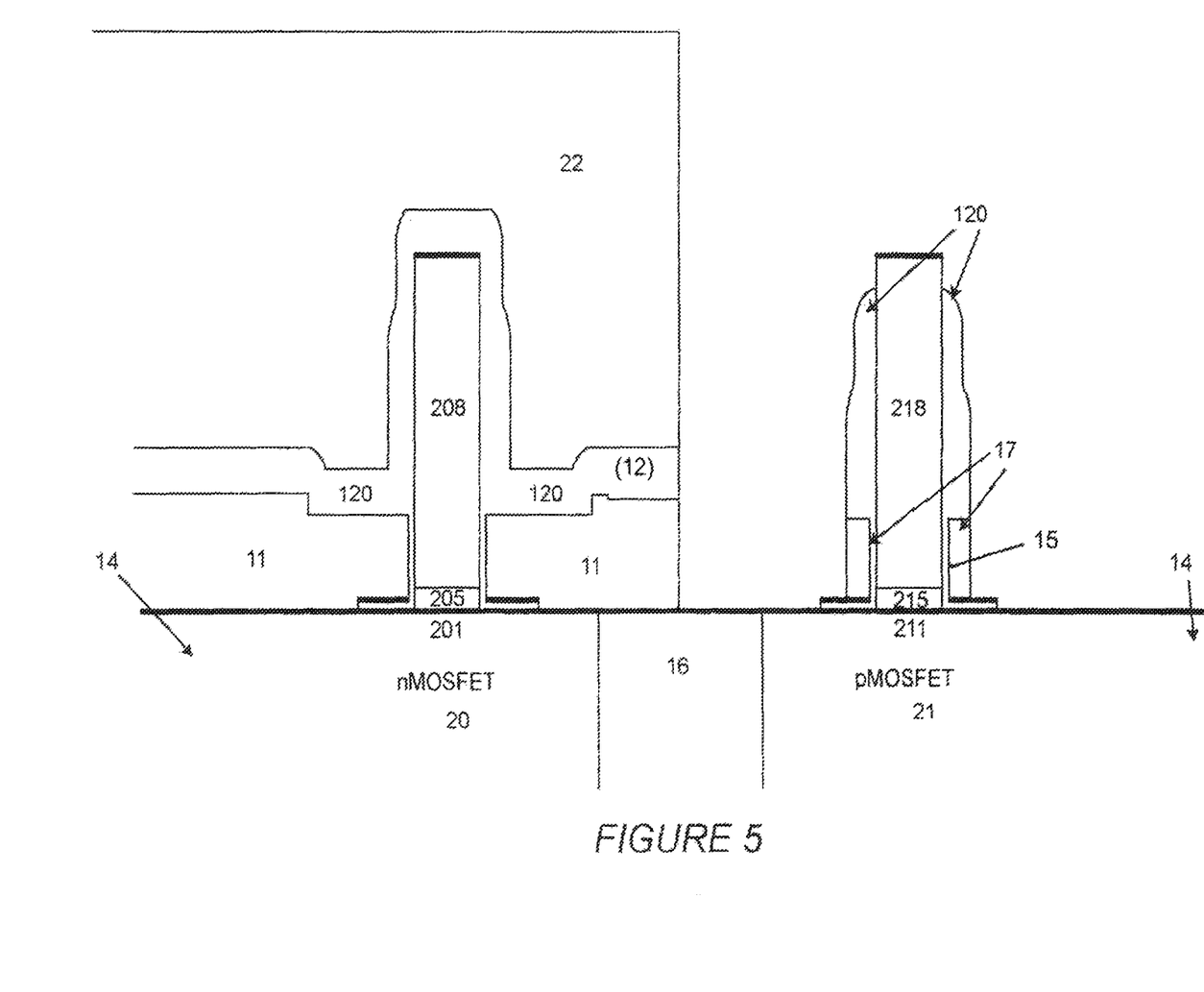
FIG. 5 is a cross-sectional view of a fourth production stage of the final exemplary pair of nMOS and pMOS transistors shown in FIG. 6 in which the original dielectric 12 is removed and replaced with a new dielectric layer 12 deposited on both the nMOS and pMOS transistors, as shown on the nMOS transistor. The nMOS transistor is then masked off by a photo resist while the tensile film and dielectric covering the pMOS transistor are subjected to etching.

FIG. 5 illustrates the fourth step taken toward reaching the exemplary final configuration shown in FIG. 6. The existing dielectric material 12 (shown in FIG. 4) is removed and a new dielectric layer 120 is deposited over both gate electrodes 208, 218 as shown over the nMOS transistor 20. This layer 120 serves to isolate stresses from later-applied layers from reaching the substrate. A blockout photo-resist 22 is applied and the dielectric and stressed film are largely removed around the pMOS transistor 21 by etching. As a result of this step, the nMOS transistor 20 is still influenced by the tensile film 11 and still maintains an enhanced level of performance, while the pMOS transistor 21 is no longer suffering a degradation of performance but resumes a normal potential performance as a result of the removal of the tensile stress provided by the stressed film 11.

FIG. 6 illustrates the fifth and final step in forming the exemplary final configuration as shown. In this step, the photo-resist 22 is first removed from the nMOS transistor 20 side of the chip and then another stressed film 13 is applied across the entire chip. This film preferably provides compressive stress to the pMOS transistor 21 thereby increasing its carrier mobility while having little, if any effect on forces in the channel of nMOS transistor 20. The nMOS transistor 20, as it is separated from the compressive film 13 by a dielectric layer 120, is largely unaffected by this step and remains under the influence of the tensile film 11 only. Now both the pMOS channel 211 and the nMOS channel 211 have enhanced carrier mobility as a result of this particular application of stressed films in relation to the transistors.

Figure 7:
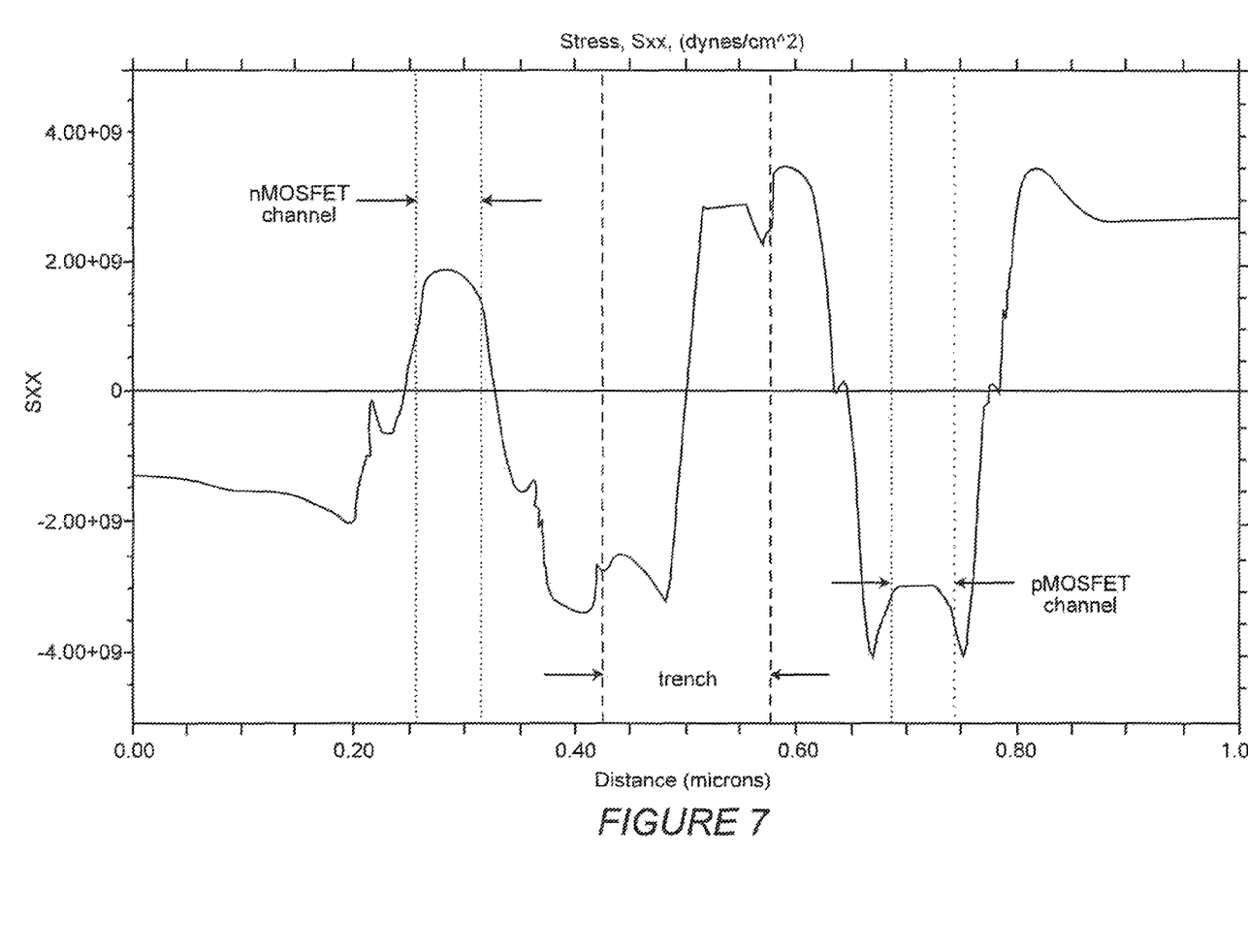
FIG. 7 is a graphical depiction of stress measurements in the lateral direction as a result of the exemplary configuration shown in FIG. 6.

FIG. 7 is a graphical representation of the resulting lateral stress levels applied to the transistors through application of this invention in simulation. This graph is based on the stress level on the transistors at a location 5 nm below the gate dielectrics 205, 215 and a stressed film thickness of 50 nm using stressed nitride for both the tensile film and the compressive film. The resulting stress oh the defined areas based on the defined conditions is approximately +190 MPa in the nMOS transistor channel 201 and −300 MPa in the pMOS transistor channel 211. Thus, it is seen that tensile and compressive stresses are produced substantially coexensive in the transistor channels 201, 211 on the same substrate 14.

Figure 8A:
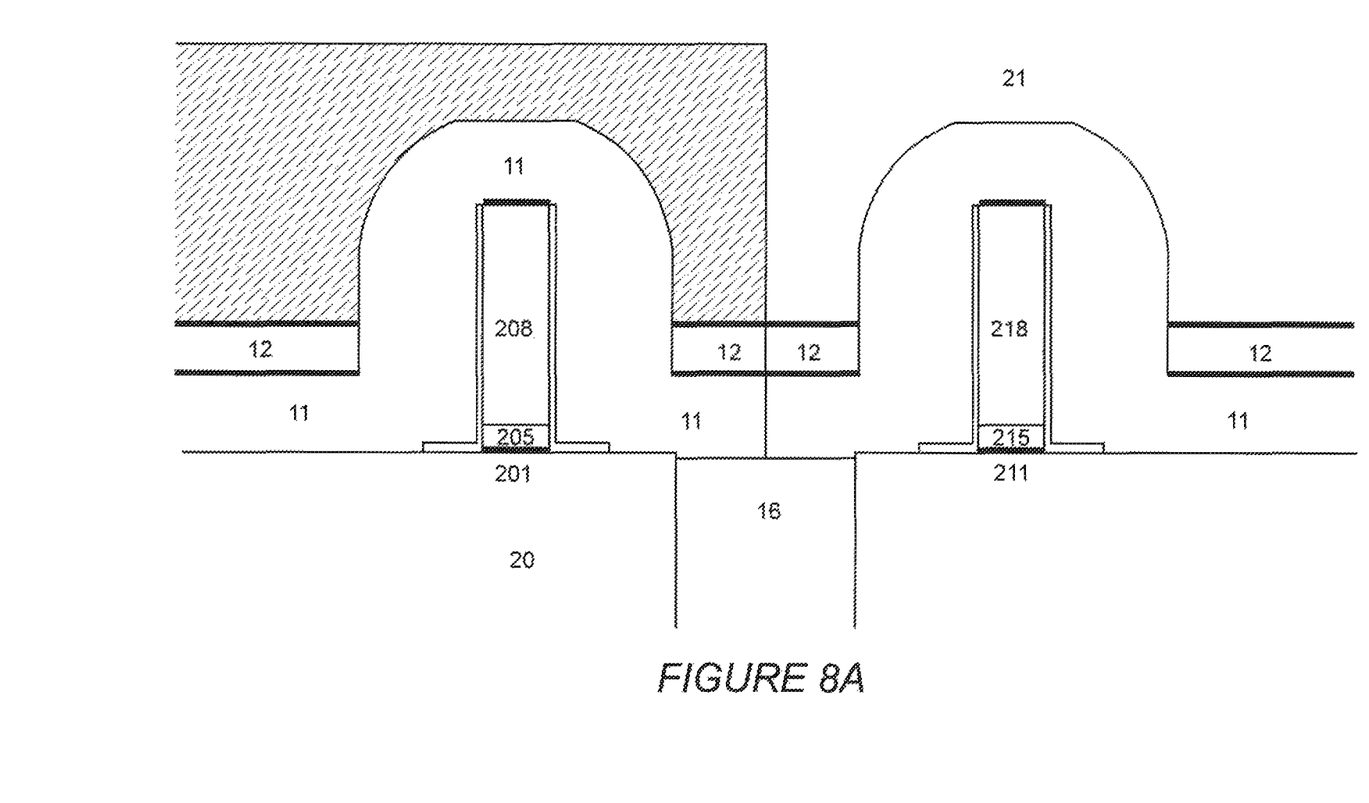
FIG. 8a is a cross-sectional view illustrating an alternate third stage for creating a second embodiment of the invention illustrated in 8c following the completion of steps one and two (as shown in FIG. 2 and FIG. 3 respectively) in which a photo-resist is applied to the nMOS transistor side of the chip or wafer.
Figure 8B:
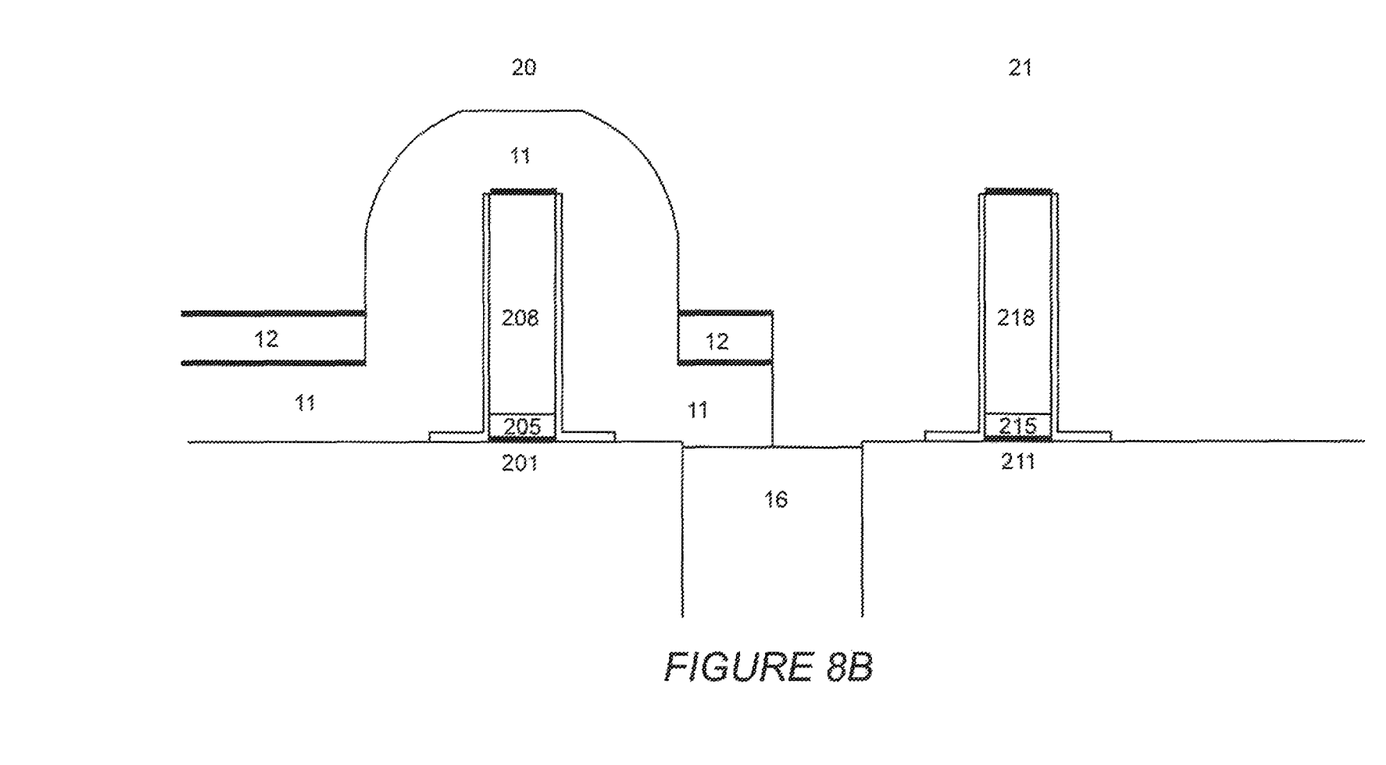
FIG. 8b is a cross-sectional view illustrating an alternate fourth stage for creating a second embodiment of the invention illustrated in FIG. 8c in which the film areas not blocked by photo-resist are removed followed by the removal of said photo-resist.
Figure 8C:
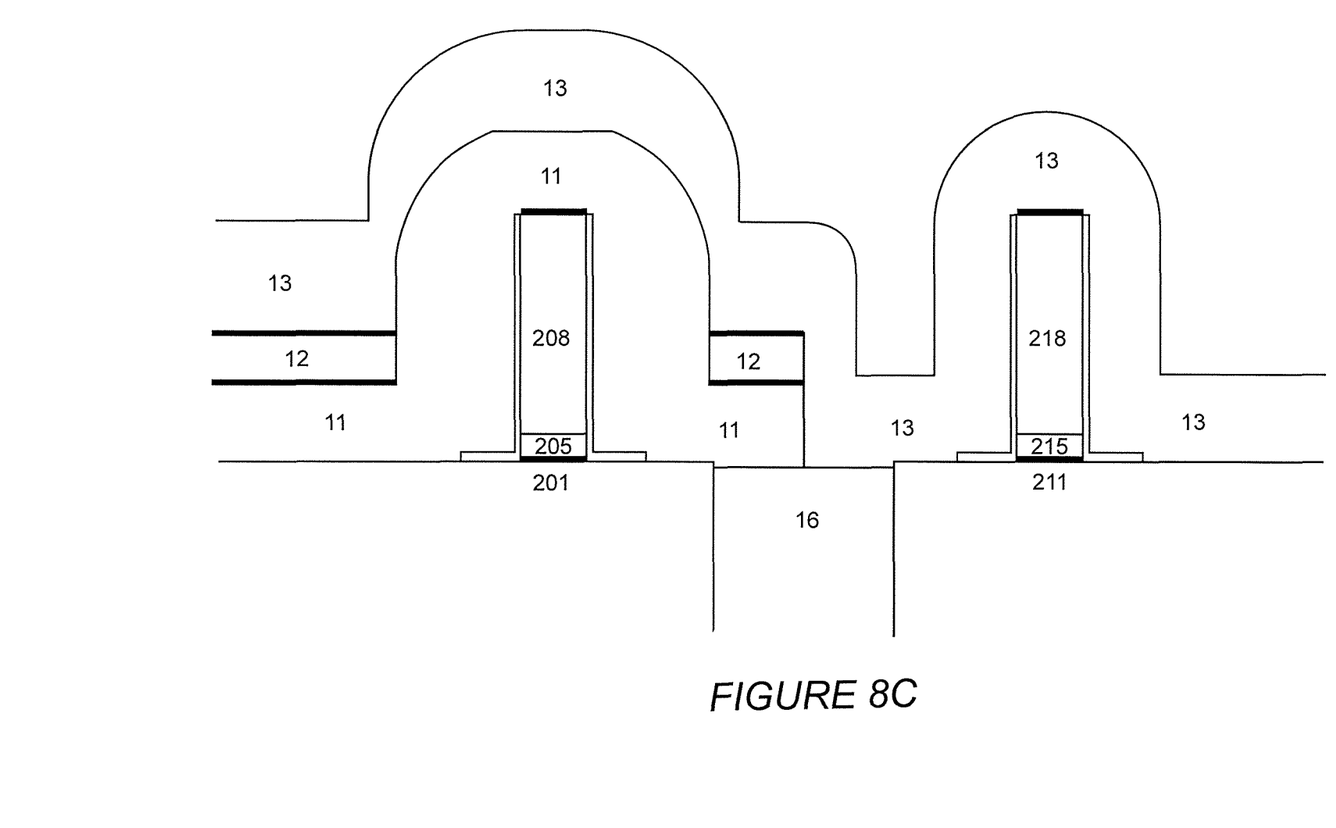
FIG. 8c is a cross-sectional view illustrating an alternate fifth stage for creating a second embodiment of the invention shown here in which a compressive film is deposited across both the nMOS and pMOS transistors.

An alternate, but similarly effective method for manufacture of transistors in accordance with the invention would involve the same progression of step one (FIG. 2) and step two (FIG. 3) but then implementing alternate steps three, four, and five as illustrated in FIGS. 8*a*, 8*b*, and 8*c*, respectively. In FIG. 8*a* a photo-resist is applied to the nMOS transistor side of the CMOS, thereby protecting it from film removal, retaining a layer of tensile film around the entire nMOS transistor gate electrode 208 and channel 201. The pMOS transistor, not covered by the photo-resist, has the layers of oxide and tensile film removed, as illustrated in FIG. 8*b*. Following the film removal, the photo-resist is also removed, also illustrated in FIG. 8*b*. A compressive film is then applied over both nMOS and pMOS transistors to achieve a second embodiment of the invention as illustrated in FIG. 8*c*.

The preferred embodiment and second embodiment provide the same function although they exhibit a few small differences in form. The preferred embodiment (FIG. 6) provides a dielectric layer separating the tensile film 11 from the compressive film 13 whereas the second embodiment (FIG. 8*c*) does not have this layer between films over the gate electrode 208 (although it does exist on the gate sides). Additionally, the tensile film does not fully surround the nMOS transistor 20 in the preferred embodiment (FIG. 6) as it does in the second embodiment (FIG. 8*c*), but rather contacts the tensile film to a portion of the gate sides only and has a neutral dielectric 120 contacting the rest of the gate electrode 208. This may result in minor dimensional variation between the first and second embodiments depending on the thicknesses of the various films. Also the contiguous compressive and tensile films 13 and 11 over the gate counteract each other in the region of the gate electrode 208.

Further, in regard to the pMOS transistor, the preferred embodiment (FIG. 6) includes a dielectric layer 120,17 surrounding the majority of the oxide liner 15 of the gate electrode 218 with exception to the top of the gate which is left to make contact with the compressive film 13. The second embodiment does not include the aforementioned dielectric layer and therefore, the entirety of the oxide liner 19 surrounding the sides of the gate electrode 218 is in contact with the compressive film 13 which makes direct contact with the top of the gate electrode 218. These differences between the first and second embodiments do not effect the stress levels within the channels 201, 211 and therefore said first and second embodiments, when compared, exhibit no significant difference from one another in potential carrier mobility.

In view of the foregoing, it is seen that the invention provides a method and structure for controlling or improving the carrier mobility in both nMOS and pMOS transistors on the same chip without compromise of manufacturing yield or adverse effects on previously formed structures or later performed processes and which can be readily controlled without compromising manufacturing yield and requiring only a few additional but well-developed processes. Since compressive and tensile forces, although potentially substantial, are applied over relatively small respective areas (in comparison, for example, to chip thickness) there is no tendency of the chip or wafer to warp or curl. It should be appreciated that while an "improvement" in carrier mobility may generally connote an increase therein, a reduction in carrier mobility may be desired and provided by the same process merely by exchanging the etch-stop layer deposition processes relative to the transistor types to thus reverse the types of tensile or compressive forces are applied to respective transistor conduction/impurity types. Since the amount of tensile or compressive stress can be controlled by deposition process parameters, hole and electron carrier mobility may thus be enhanced, reduced or regulated to any desired degree within the range of the effect of tensile and compressive force thereon depending also on the geometry of the gate.

While the invention has been described in terms of a single preferred embodiment, those skilled in the art will recognize that the invention can be practiced with modification within the spirit and scope of the appended claims.

The invention claimed is:

1. A method of adjusting carrier mobility in semiconductor devices comprising the steps of
    depositing a first stressed film on a wafer including first and second transistors to create a stress in the channels of the transistors,
    partially removing said first stressed film to relieve said stress from a channel of one said transistor such that a portion of said first stressed film remains on a surface adjacent a channel region of another said transistor,
    forming a dielectric layer capable of isolating shear forces applied to opposite surfaces thereof on said portion of said first stressed film before or after said step of partially removing said first stressed film,
    depositing a second stressed film over said first and second transistors to apply a second stress to the channel of the transistor having said first stressed film removed whereby said second stressed film applies stress to said another transistor while stress applied to said transistor by said first stressed film is substantially unaffected, and
    substantially completing said transistor and said another transistors with said another transistor having both first and second stressed films applied thereto.

2. A method as recited in claim 1 in which said transistor and said another transistor are of different conductivity types.

3. A method as recited in claim 2 in which said first film and second film apply opposing stresses.

4. A method as recited in claim 3 wherein the carrier mobility is regulated by applying a tensile stress to said transistor while applying a compressive stress to said another transistor.

5. A method as recited in claim 4 wherein at least one stressed film is applied using plasma enhanced chemical vapor deposition (PECVD).

6. A method as recited in claim 4 wherein at least one stressed film is applied using thermal chemical vapor deposition (CVD).

7. A method as recited in claim 5 wherein at least one stressed film is applied using thermal(CVD).

8. A method as recited in claim 4 further comprising the steps of:
    applying a blocking layer to said transistor;
    partially or fully removing said first stressed film from said another transistor;
    removing said blocking layer from said first transistor; and
    applying said second stressed film over the first and second transistors.

9. A method of adjusting carrier mobility in semiconductor devices wherein said transistor and said another transistor are of opposite conductivity types and comprise a CMOS pair of transistors, said method further comprising the steps of:
    depositing a first stressed film on a wafer including first and second transistors to create a stress in the channels of the transistors,
    partially removing said first stressed film to relieve said stress from a channel of one said transistor such that a portion of said first stressed film remains on a surface adjacent a channel region of another said transistor,
    forming a dielectric layer on said portion of said first stressed film before or after said step of partially removing said first stressed film,
    depositing a second stressed film over said first and second transistors to apply a second stress to the channel of the transistor having said first stressed film removed, wherein said first stressed film and said second stressed film apply opposing forces and wherein the carrier mobility is regulated by applying a tensile stress to said transistor while applying a compressive stress to said another transistor,
    partially or fully removing said first stressed film from both said transistor and said another transistors as masked by an oxide layer;
    removing said oxide layer and depositing a shear force isolation layer across the entire CMOS pair;
    applying a blocking layer to said transistor and associated portions of said layers/films;
    removing layer/film portions associated with said another transistor;
    removing said blocking layer from said transistor; and
    depositing said second stressed film over said transistor and said another transistor.

* * * * *